(12) United States Patent
Jang et al.

(10) Patent No.: US 8,296,610 B2
(45) Date of Patent: Oct. 23, 2012

(54) SEMICONDUCTOR MEMORY DEVICE AND METHOD FOR TESTING THE SAME

(75) Inventors: Ji-Eun Jang, Kyoungki-do (KR); Seok-Cheol Yoon, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 947 days.

(21) Appl. No.: 12/181,700

(22) Filed: Jul. 29, 2008

(65) Prior Publication Data

US 2009/0172479 A1 Jul. 2, 2009

(30) Foreign Application Priority Data

Dec. 26, 2007 (KR) .................. 10-2007-0137427

(51) Int. Cl.
*G06F 11/00* (2006.01)
(52) U.S. Cl. .............. 714/718; 714/27; 714/42
(58) Field of Classification Search ............. 714/27, 714/42, 718
See application file for complete search history.

(56) References Cited

U.S. PATENT DOCUMENTS

| | | | | |
|---|---|---|---|---|
| 6,317,372 B1 * | 11/2001 | Hayashi et al. | | 365/201 |
| 7,546,497 B2 * | 6/2009 | Jang | | 714/718 |
| 7,739,560 B2 * | 6/2010 | Saito | | 714/710 |
| 7,913,126 B2 * | 3/2011 | Nakagawa et al. | | 714/710 |
| 2003/0005372 A1 * | 1/2003 | Hsiao et al. | | 714/718 |
| 2005/0010841 A1 * | 1/2005 | Lee et al. | | 714/718 |
| 2005/0193293 A1 * | 9/2005 | Shikata | | 714/718 |
| 2006/0090107 A1 * | 4/2006 | Itoga et al. | | 714/718 |
| 2007/0050167 A1 * | 3/2007 | Johnson | | 702/117 |
| 2008/0046788 A1 * | 2/2008 | Lee et al. | | 714/718 |

FOREIGN PATENT DOCUMENTS

| | | |
|---|---|---|
| JP | 11-213699 | 8/1999 |
| KR | 100164397 B1 | 9/1998 |
| KR | 1020030089181 A | 11/2003 |

OTHER PUBLICATIONS

Notice of Allowance issued from Korean Intellectual Property Office on Nov. 6, 2009.
Notice of Preliminary Rejection issued from Korean Intellectual Property Office on Apr. 7, 2009 with an English Translation.

* cited by examiner

*Primary Examiner* — Joshua Lohn
(74) *Attorney, Agent, or Firm* — IP & T Group LLP

(57) ABSTRACT

A semiconductor memory device includes an alignment unit configured to align data received from the outside, a plurality of data input/output lines corresponding to the aligned data, respectively and a realignment unit configured to change correspondence between the data and the data input/output lines in response to one or more change signals in a test mode. A method for testing the semiconductor memory device includes inputting data in series using a testing apparatus, aligning the serial data in parallel, and realigning the parallel data in response to one or more change signals.

13 Claims, 5 Drawing Sheets

SEMICONDUCTOR MEMORY DEVICE AND METHOD FOR TESTING THE SAME

CROSS-REFERENCE TO RELATED APPLICATIONS

The present invention claims priority of Korean patent application number 10-2007-0137427, filed on Dec. 26, 2007, which is incorporated by reference in its entirety.

BACKGROUND OF THE INVENTION

The present invention relates to a semiconductor memory device, and more particularly, to a semiconductor memory device capable of changing the sequence in which data is input in a test mode to enhance an ability to screen the data.

FIG. 1 is a block diagram of a typical semiconductor memory device for aligning received data for transfer to data input/output lines.

Referring to FIG. 1, the typical semiconductor memory device includes an input buffer unit 110, an alignment unit 120, a matching unit 130, and a driver unit 140 to receive data DQ_I at a data pin DQ and transfer the received data to data input/output lines GIO0 to GIO7.

The input buffer 110 buffers data input in series through the data pin DQ.

The alignment unit 120 aligns the serial input data DQ_I in parallel using rising and falling data strobe signals DQSR and DQSF. The data D0 to D7 are input in series according to a burst length (BL). FIG. 1 illustrates the case where the BL is 8. Accordingly, when eight data are input in a sequence of D0, D1, D2, D3, D4, D5, D6 and D7, the data are aligned as follows: D0=ALIGNR_0 D1=ALIGNF_0 D2=ALIGNR_1, D3=ALIGNF_1, D4=ALIGNR_2, D5=ALIGNF_2, D6=ALIGNR_3 and D7=ALIGNF_3.

Basically, the matching unit 130 matches the lines ALIGNR_0, ALIGNR_1, ALIGNR_2 and ALIGNR_3 to the lines ALIGNRD_0, ALIGNRD_1, ALIGNR_2 and ALIGNRD_3 and the lines ALIGNF_0, ALIGNF_1, ALIGNF_2 and ALIGNF_3 to the lines ALIGNFD_0, ALIGNFD_1, ALIGNFD_2 and ALIGNFD_3, respectively, in the above-listed sequences (note that BL=8 basically in a DDR3 memory device as shown in FIG. 1). Therefore, the data D0 to D7 are sequentially loaded on the input/output lines GIO0 to GIO7.

When the BL is 4 (i.e., a signal BL4 is activated), the matching unit 130 transfers the data from the lines ALIGN_2 and ALIGN_3 to the lines ALIGNED_0 and ALIGNED_1 (hereinafter, ALIGN represents both ALIGNR and ALIGNF, and ALIGNED represents both ALIGNRD and ALIGNFD), whereas it transfers the data from the lines ALIGN_0 and ALIGN_1 to the lines ALIGNED_0 and ALIGNED_1 respectively, in the above-listed sequences. Accordingly, four data D0, D1, D2 and D3 input thereinto according to the BL are sequentially loaded on the input/output lines GIO0, GIO1, GIO2 and GIO3, respectively, in the above-listed sequence. In an on-the-fly mode (i.e., a signal BLFLYB is at a logic low level), the matching unit 130 transfers data from the lines ALIGN_0 and ALIGN_1 to the lines ALIGNED_2 and ALIGNED_3, whereas it transfers data from the lines ALIGN_0 and ALIGN_1 to the lines ALIGNED_0 ALIGNED_1 in the above-listed sequences. Accordingly, the four data D0, D1, D2 and D3 input thereinto are sequentially loaded on the input/output lines GIO4, GIO5, GIO6 and GIO7, respectively, in the above-listed sequence.

The matching unit 130 is provided to the memory device to support burst lengths other than the basic burst length. For example, a DDR3 memory device as shown in FIG. 1 may be provided with the matching unit for supporting the burst length of 4 and the on-the-fly mode as well as the burst length of 8. Accordingly, in a case where only one burst length is used, the memory device may not include the matching unit 130.

FIG. 2 is a circuit diagram of the matching unit 130 of the typical semiconductor memory device shown in FIG. 1.

Referring to FIG. 2, the typical matching unit 130 includes a plurality of multiplexers 210, 220, 230 and 240 each of which selects one of two signals (data) according to the signal BL4 or the signal BLFLYB. The symbols of R and F are omitted in FIG. 2 because the line ALIGNR and the line ALIGNF has the same configuration as the line ALIGN shown in FIG. 2. Therefore, the matching unit 130 of FIG. 1 includes two of the circuit shown in FIG. 2 (i.e., eight multiplexers).

When BL=8, and both of the signal BL4 and the signal BLFLYB are deactivated (i.e., the signal BL4 is at a logic low level, and the signal BLFLYB is at a logic high level), the lines ALIGN_0, ALIGN_1, ALIGN_2 and ALIGN_3 are matched to the lines ALIGNED_0, ALIGNED_1, ALIGNED_2 and ALIGNED_3, respectively, in the above-listed sequence.

When BL=4, and the signal BL4 is activated to a logic high level the lines ALIGN_2 and ALIGN_3 may be matched to the lines ALIGNED_0 and ALIGNED_1 and may also be matched to the lines ALIGNED_2 and ALIGNED_3. However, it doesn't matter because the number of data input at a time is 4, instead of 8 in this case.

In an on-the-fly mode, when the signal BLFLYB is activated to a logic low level, the lines ALIGN_1 and ALIGN_2 may be matched to the lines ALIGNED_2 and ALIGNED_3, and may also be matched to the lines ALIGNED_1 and ALIGNED_2. However, it also doesn't matter because the number of data input at a time is 4, instead of 8, in this mode.

FIG. 3 illustrates an operation of a typical semiconductor memory device for aligning serial input data in parallel for transfer to data input/output lines.

Referring to FIG. 3 (showing the case of BL=8), the semiconductor memory device aligns the serial input data in parallel to output the aligned data to data input/output lines GIO0 to GIO7 in the sequence of their input.

FIG. 3 shows the case where data are input into the memory device by a testing apparatus. Note that in FIG. 3 data D0, D1, D2 and D3 have a logic high level and data D4, D5, D6 and D7 have a logic low level. This represents the case where the data input/output speed of the memory device (for example, 800 MHz) is four times faster than that of the testing apparatus (for example, 200 MHz), and thus the testing apparatus can change the logic levels of the data by the unit of four data (for example, the data D0 to D3, and the data D4 to D7, respectively).

With the development of the technology, the operating speed of the semiconductor memory device is increasing. However, memory manufacturer would not change the testing apparatus immediately to meet the increased operating speed. This is because of the increase of manufacturing cost. Therefore, in a test mode, it could happen that a string of data (for example, D0, D1, D2 and D3) are input into the semiconductor memory device to have the same logic level. Generally, in the test mode, various data patterns are used to detect various defects efficiently. In order to realize various data patterns, it is required to write desired data at desired location. Therefore, there are occasions where a string of data must have different logic levels (for example, D0 has a logic high level, D1 has a logic low level, D2 has a logic high level, and D3 has a logic low level).

However, when the testing apparatus is slower than the memory device as shown in FIG. 3, it is difficult to realize various data patterns freely. As a result, the ability to screen to detect various defects in the memory device may be reduced.

SUMMARY OF THE INVENTION

Embodiments of the invention are directed to providing a semiconductor memory device capable of realizing various data patterns using a testing apparatus slower than the semiconductor memory device, and a method for testing the same.

In accordance with an aspect of the invention, there is provided an alignment unit configured to align data received from the outside, a plurality of data input/output lines corresponding to the aligned data, respectively and a realignment unit configured to change correspondence between the data and the data input/output lines in response to one or more change signals in a test mode. In accordance with anther aspect of the invention, there is provided an alignment unit configured to align externally supplied data, a plurality of data input/output lines configured to transfer the aligned data and a realignment unit configured to selectively realign the aligned data transferred through the data input/output lines, in response to one or more change signals when the device is in a test mode. In accordance with anther aspect of the invention, there is provided an alignment unit configured to the align serial input data in parallel, a plurality of data input/output lines corresponding to the aligned data, respectively, a matching unit configured to set correspondence between the aligned data and the data input/output lines in response to a burst length setting signal and an on-the-fly mode signal and a test unit configured to activate the burst length setting signal and the on-the-fly mode signal when a change signal is activated and the device is in a test mode. In accordance with anther aspect of the invention, there is provided a method for testing a semiconductor memory device, the method includes a step of inputting data in series using a testing apparatus, a step of aligning the serial data in parallel and a step of realigning the parallel data in response to one or more change signals.

DESCRIPTION OF SPECIFIC EMBODIMENTS

Hereinafter, a semiconductor memory device and a method for testing the same in accordance with the invention will be described in detail with reference to the accompanying drawings. It should be understood that all references to alignment include alignment and vice a versa, and that all references to realignment include realignment and vice a versa.

Figure 4:
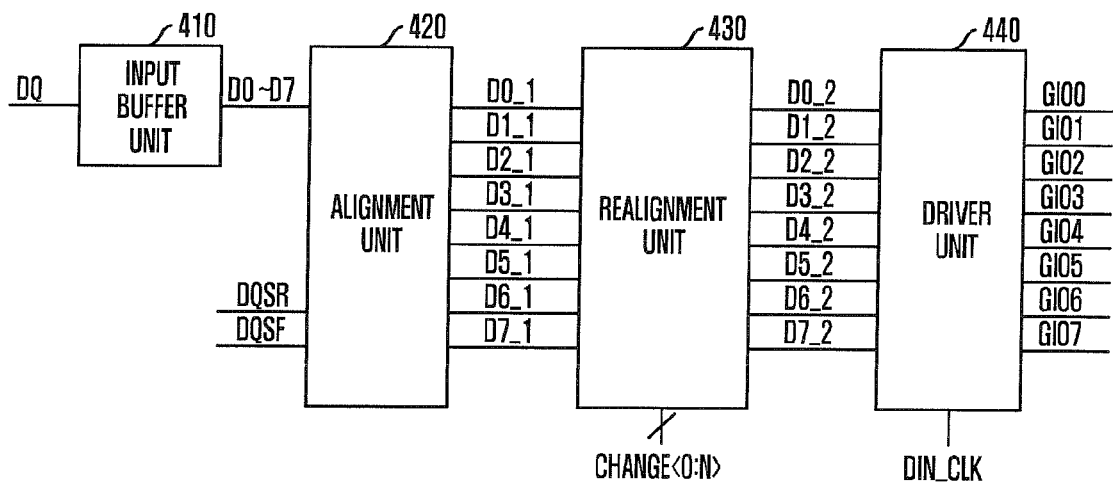
FIG. 4 is a block diagram of a semiconductor memory device for aligning received data for transfer to data input/output lines in accordance with a first embodiment of the invention.

FIG. 4 is a block diagram of a semiconductor memory device for aligning received data for transfer to data input/output lines in accordance with a first embodiment of the invention.

Referring to FIG. 4, the semiconductor memory device includes an alignment unit 420 configured to align or align data D0 to D7 input from the outside, a plurality of data input/output lines GIO0 to GIO7 corresponding to the respective data D0 to D7, and a realignment unit 430. The realignment unit 430 changes correspondence between the data D0_1 to D7_1 and the data input/output lines GIO0 to GIO7 in response to one or more change signals CHANGE<0:N>, in a test mode.

The alignment unit 420 aligns or aligns serial input data D0 to D7 in parallel on the basis of data strobe signals DQSR and DQSF. The data D0 to D7 are input in series from the outside to the alignment unit 420 through a data pin DQ and then through an input buffer 410. The alignment unit 420 changes the serial data D0 to D7 to parallel data D0_1 to D7_1. This is because the present memory device needs data aligned in this manner. However, the invention is not limited thereto. Instead, the operation of the alignment unit 420 may be modified according to a data alignment type defined in the specification.

The data D0_1 to D7_1 correspond to the data input/output lines GIO0 to GIO7, respectively. In a normal mode, the data D0_1 to D7_1 correspond to the data input/output lines GIO0 to GIO7, respectively, in the above-listed sequence.

The realignment unit 430 changes correspondence between the aligned data D0_1 to D7_1 and the data input/output lines GIO0 to GIO7 in response to one or more change signals CHANGE<0:N>, in a test mode. As the number of the change signals CHANGE<0:N> increases, the correspondence between the aligned data D0_1 to D7_1 and the data input/output lines GIO0 to GIO7 can be changed in more various ways.

For example, in the case where four change signals CHANGE<0:3> are used, the realignment unit 430 may be designed to output the aligned data D0_1 as the realigned data D1_2 and the aligned data D1_1 as the realigned data D0_2 when the change signal CHANGE<0> is activated; output the aligned data D2_1 as the realigned data D3_2 and the aligned data D3_1 as the realigned data D2_2 when the change signal CHANGE<1> is activated; and the like. In the case where only one change signal CHANGE<0> is used, the realignment unit 430 may be designed to output the aligned data D0_1, D1_1, D2_1 and D3_1 as the realigned data D4_2, D5_2, D6_2 and D7_2 and the aligned data D4_1, D5_1, D6_1 and D7_1 as the realigned data D0_2, D1_2, D2_2 and D3_2 when the change signal CHANGE<0> is activated.

If the realignment unit 430 changes the aligned sequence of the aligned data D0_1 to D7_1 to output the realigned data D0_2 to D7_2, the correspondence between the aligned data D0_1 to D7_1 and the data input/output lines GIO0 to GIO7 is also changed. How many change signals CHANGE<0:N> are to be used and how the correspondence between the aligned data D0_1 to D7_1 and the data input/output lines GIO0 to GIO7 is changed in response to the change signals CHANGE<0:N> may be designed appropriately depending on the occasion.

Even if the data D0 to D3 of a logic high level are input and the data D4 of D7 of a logic low level are input due to the limitation of the testing apparatus, the realignment unit 430 can change the correspondence between the aligned data D0_1 to D7_1 and the data input/output lines GIO0 to GIO7. For example, the correspondence may be changed as follows: the data D0 has a logic high level; the data D1 has a logic low level; the data D2 has a logic high level; the data D3 has a logic low level; the data D4 has a logic high level; the data D5 has a logic low level; the data D6 has a logic high level; and the data D7 has a logic low level.

The driver 440 is disposed after the realignment unit 430 to load the realigned data D0_2 to D7_2 output from the realignment unit 430 on the data input/output lines GIO0 to GIO7, respectively.

The semiconductor memory device in accordance with the first embodiment does not include a matching unit. However, since the realignment unit 430 outputs the aligned data D0_1 to D7_1 in the sequence of their input without any change (i.e. D0_1=D0_2, D1_1=D1_2, D2_1=D2_2, D3_1=D3_2, D4_1=D4_2, D5_1=D5_2, D6_1=D6_2, and D7_1=D7_2) in a normal mode, the typical matching unit may be provided before or after the realignment unit 430. Then, the semiconductor memory device can support various modes such as the BL4 mode and the on-the-fly mode.

For reference, the typical matching unit 130 sets the correspondence of the data according to the specification for each mode such as the BL=8 mode, the BL=4 mode, the on-the-fly mode, and the like, in a normal mode. However, the realignment unit 430 in accordance with the first embodiment sets the correspondence of the data to be different from the specification in order to realize various data patterns, in a test mode.

Figure 5:
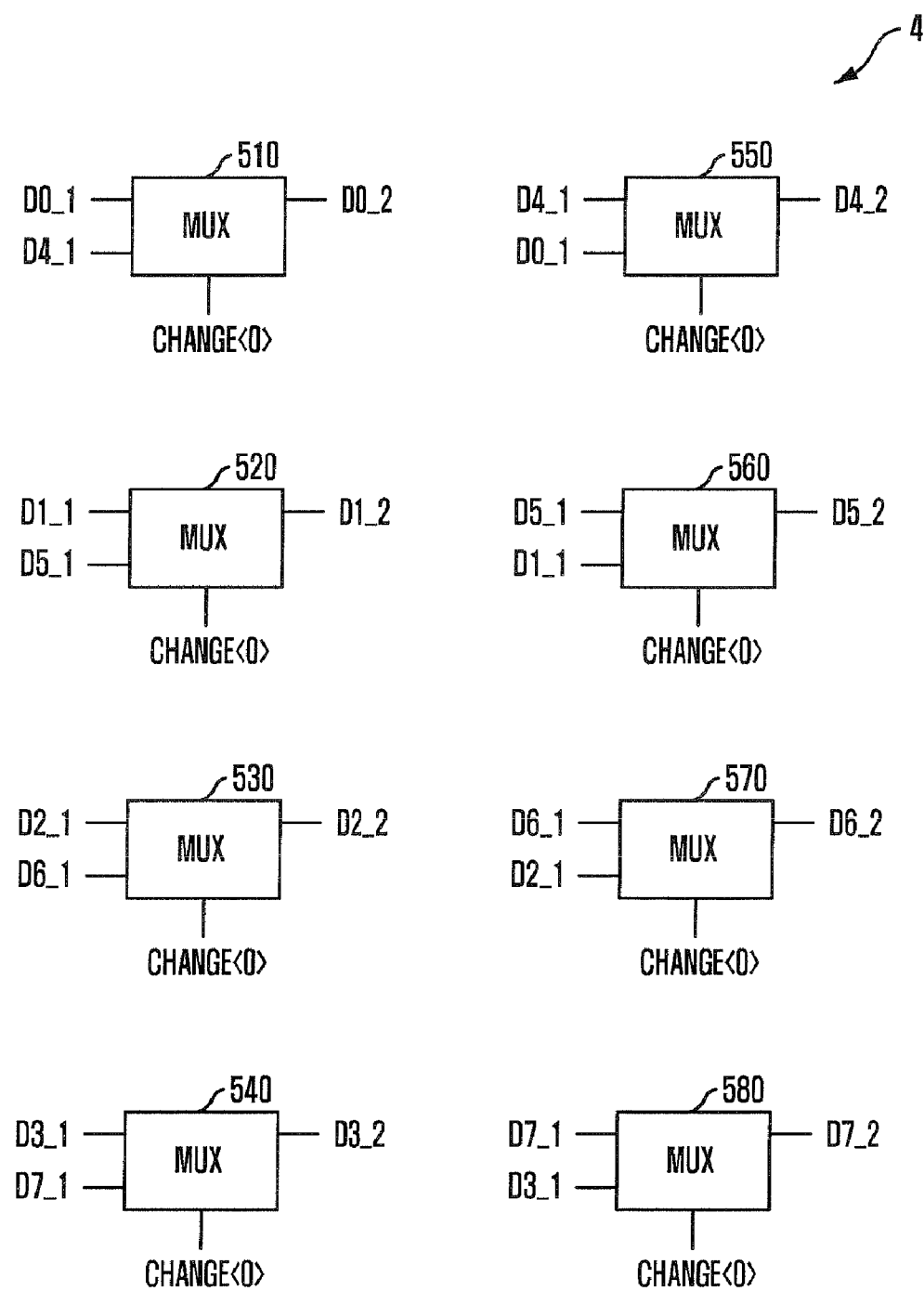
FIG. 5 illustrates a realignment unit of the semiconductor memory device shown in FIG. 4.

FIG. 5 illustrates a realignment unit of the semiconductor memory device shown in FIG. 4.

Referring to FIG. 5, the realignment unit 430 receives only one change signal CHANGE<0> to change the correspondence between the aligned data D0_1 to D7_1 and the data input/output lines GIO0 to GIO7. When the change signal CHANGE<0> is activated, the aligned data D0_1, D1_1, D2_1 and D3_1 correspond to the data input/output lines GIO4, GIO5, GIO6 and GIO7, and the aligned data D4_1, D5_1, D6_1 and D7_1 correspond to the data input/output lines GIO0, GIO1, GIO2 and GIO3, respectively, in the above-listed sequence. However, it should be noted that the realignment unit 430 may also receive a plurality of change signals CHANGE<0:N> to variously change the correspondence between the aligned data D0_1 to D7_1 and the data input/output lines GIO0 to GIO7, as described above.

As shown in FIG. 5, the realignment unit 430 may include a plurality of multiplexers 510, 520, 530, 540, 550, 560, 570 and 580 each of which selects one of the two input aligned data in response to the change signal CHANGE<0>.

When the change signal CHANGE<0> is deactivated, the multiplexer 510 outputs the aligned data D0_1 as the realigned data D0_2, so that the aligned data D0_1 is transferred to the data input/output line GIO0. In contrast, when the change signal CHANGE<0> is activated, the multiplexer 510 outputs the aligned data D4_1 as the realigned data D0_2, so that the aligned data D4_1 is transferred to the data input/output line GIO0. Operations of the other multiplexers 520, 530, 540, 550, 560, 570 and 580 are similar to the operation of the multiplexer 510. As such, the realignment unit 430 can change the correspondence between the aligned data D0_1 to D7_1 and the data input/output lines GIO0 to GIO7 in response to the change signal CHANGE<0>.

Like the realignment unit 430 using single change signal CHANGE<0> described above with reference to FIG. 5, the realignment unit using a plurality of change signals CHANGE<0:N> may also include multiplexers to select output signals from input signals in response to the change signals.

Figure 6:
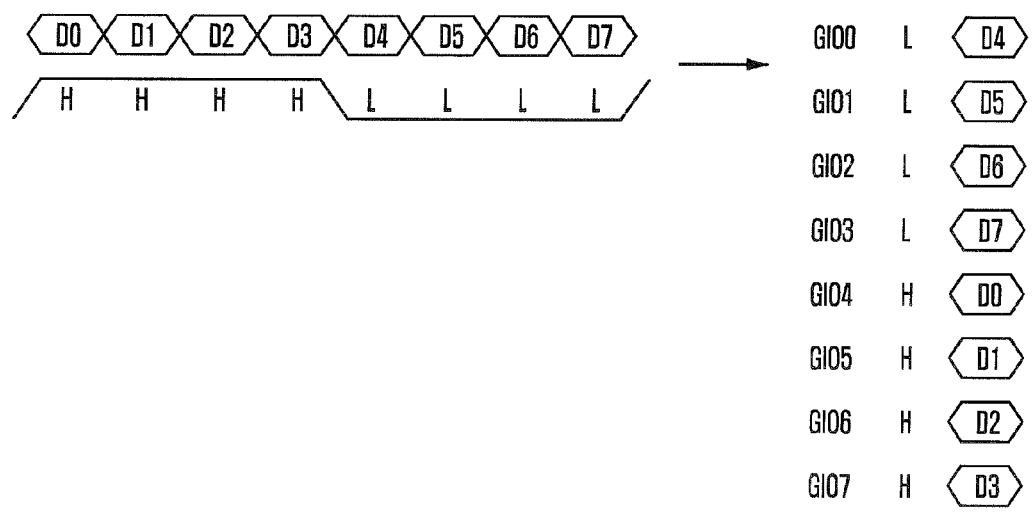
FIG. 6 illustrates an operation of a semiconductor memory device in accordance with an embodiment of the invention when the realignment unit has the configuration shown in FIG. 5 and the change signal CHANGE<0> is activated.

FIG. 6 illustrates an operation of a semiconductor memory device in accordance with an embodiment of the invention when the realignment unit has the configuration shown in FIG. 5 and the change signal CHANGE<0> is activated.

Referring to FIG. 6, data D0 to D3 of a logic high level and data D4 to D7 of a logic low level are input into the semiconductor memory device. However, the data D0, D1, D2 and D3 are loaded on data input/output lines GIO4, GIO5, GIO6 and GIO7, and the data D4, D5, D6 and D7 are loaded on data input/output lines GIO0, GIO1, GIO2 and GIO3, respectively, in the above-listed sequences. In other words, the data D0 to D7 are not loaded on the data input/output lines in the sequence of their input. The sequence of the data D0 to D7 is changed before the data D0 to D7 are loaded on the data input/output lines GIO0 to GIO7.

FIG. 6 shows the case where the realignment unit 430 of the semiconductor memory device has the configuration shown in FIG. 5. If the realignment unit 430 has a configuration different from that of FIG. 5, the sequence of data loaded on the input/output lines may also be different from that of FIG. 6. For example, it is possible to receive data D0 to D7 having logic levels of 'High', 'High', 'High', 'High', 'Low', 'Low', 'Low' and 'Low', respectively, to load data having logic levels of 'High', 'Low', 'High', 'Low', 'High', 'Low', 'High' and 'Low' on the data input/output lines GIO0 to GIO7, respectively.

Figure 7:
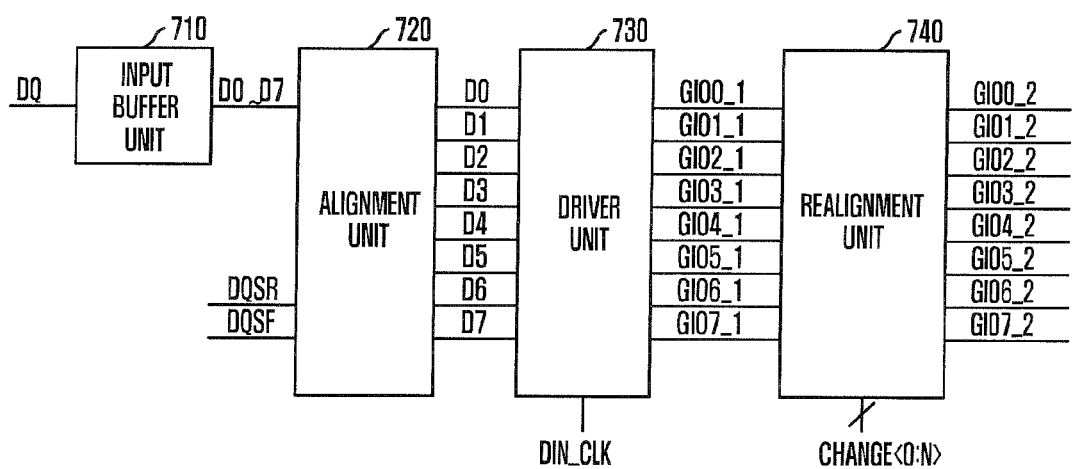
FIG. 7 is a block diagram of a semiconductor memory device for aligning received data for transfer to data input/output lines in accordance with a second embodiment of the invention.

FIG. 7 is a block diagram of a semiconductor memory device for aligning received data for transfer to data input/output lines in accordance with a second embodiment of the invention.

Referring to FIG. 7, the semiconductor memory device includes an alignment unit 720 configured to align data D0 to D7 input from the outside, a plurality of data input/output lines GIO0 to GIO7 configured to transfer the aligned data D0 to D7, and a realignment unit 740. The realignment unit 740 realigns data loaded on the data input/output lines GIO0 to GIO7 in response to one or more change signals CHANGE<0:N>, in a test mode.

The alignment unit 720 aligns serial input data D0 to D7 in parallel. The alignment unit 720 has the same configuration as the alignment unit 420 described in the first embodiment with reference to FIG. 4, and thus a detailed description thereof will be omitted herein. The aligned data D0 to D7 correspond to the data input/output lines GIO0 to GIO7, respectively. The data D0 to D7 correspond to the data input/output lines GIO0 to GIO7, respectively, in the sequence of their input. The driver 730 loads the aligned data on the data input/output lines GIO0 to GIO7.

The realignment unit 740 realigns the data loaded on the data input/output lines GIO0_1 to GIO7_1 in response to one or more change signals CHANGE<0:N>. Accordingly, in a normal mode, when the change signals CHANGE<0:N> are deactivated, the sequence of data input into the realignment unit 740 through the data input/output lines GIO0_1 to GIO7_1 is identical to the sequence of data output from the realignment unit 740 through the data input/output lines GIO0_2 to GIO7_2. On the contrary, in a test mode, when the change signals CHANGE<0:N> are activated, the sequence of data input into the realignment unit 740 through the data input/output lines GIO0_1 to GIO7_1 is different from the sequence of data output from the realignment unit 740 through the data input/output lines GIO0_2 to GIO7_2.

The realignment unit 740 may have the same configuration as the realignment unit 430 described above in the first embodiment. The realignment unit 740 may also have the configuration shown in FIG. 5. The only difference is that the realignment unit 740 realigns data loaded on the data input/output lines GIO0 to GIO7, whereas the realignment unit 430 realigns data before being loaded on the data input/output lines GIO0 to GIO7, to change correspondence between the data D0 to D7 and the data input/output lines GIO0 to GIO7.

The realignment unit 740 can be appropriately designed depending on the occasion, with respect to how many change signals CHANGE<0:7> are to be used and how the data loaded on the data input/output lines GIO0 to GIO7 are realigned in response to the change signals CHANGE<0:N>.

FIG. 7 shows the case where the realignment unit 740 realigns data loaded on the global input/output lines GIO0 to GIO7. The case where the realignment unit 740 realigns data loaded on local input/output lines LIO may also be possible. However, the latter case is not preferable because the local input/output line LIO needs a pair of lines LIOA and LIOB for transferring single data.

Operations and effects of the semiconductor memory device are the same as those of the semiconductor memory device above described in the first embodiment except that the realignment unit 740 realigns data loaded on the data input/output lines GIO0 to GIO7. Accordingly, a detailed description thereof will be omitted herein.

Figure 8:
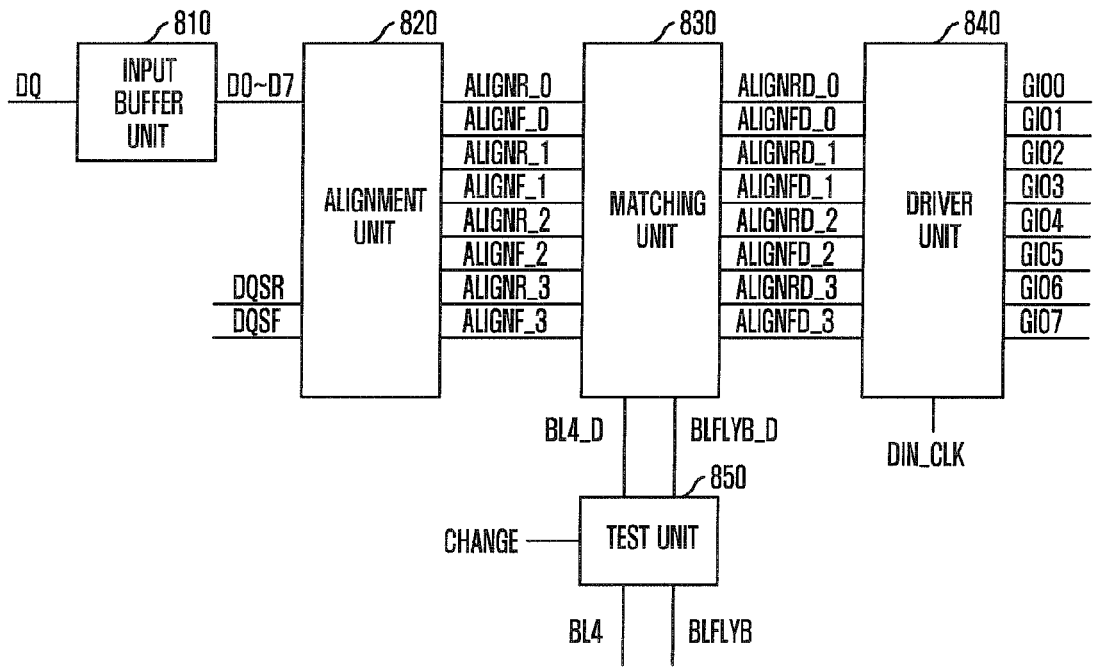
FIG. 8 is a block diagram of a semiconductor memory device for aligning received data for transfer to data input/output lines in accordance with a third embodiment of the invention.

FIG. 8 is a block diagram of a semiconductor memory device for aligning received data for transfer to data input/output lines in accordance with a third embodiment of the invention.

Figure 1:
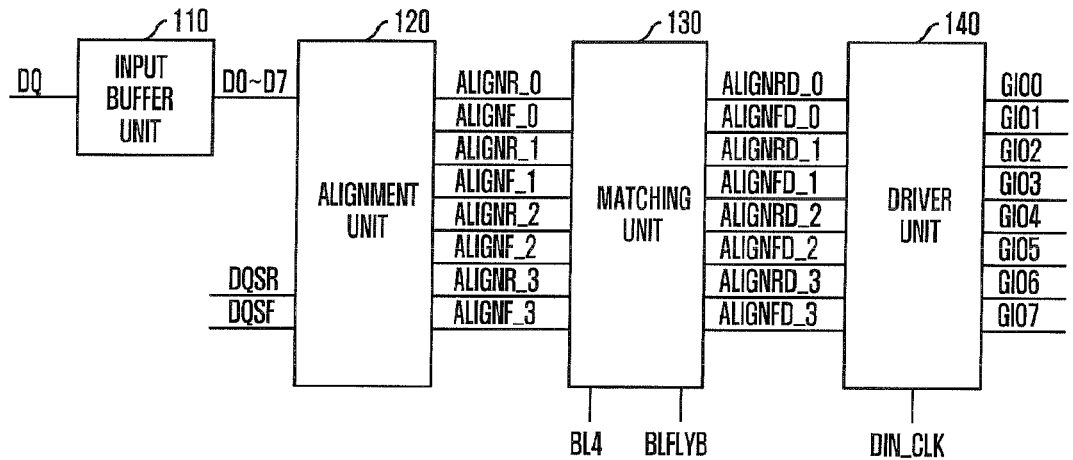
FIG. 1 is a block diagram of a typical semiconductor memory device for aligning received data for transfer to data input/output lines.
Figure 2:
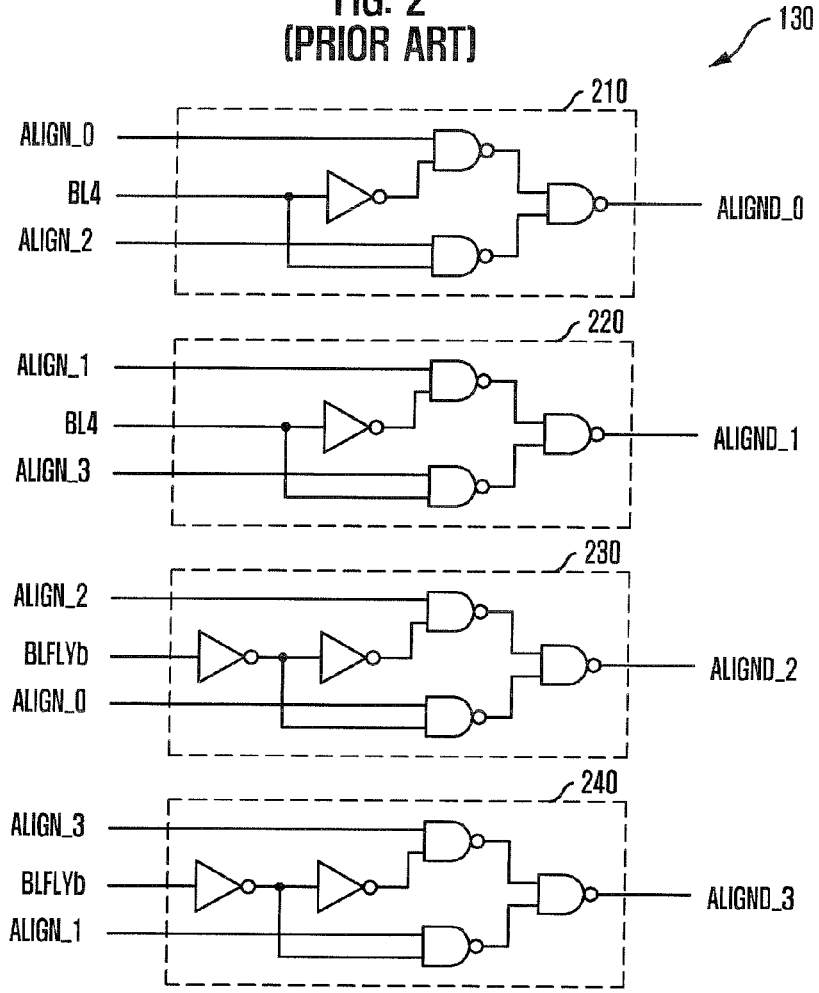
FIG. 2 is a circuit diagram of a matching unit 130 of the typical semiconductor memory device shown in FIG. 1.
Figure 3:
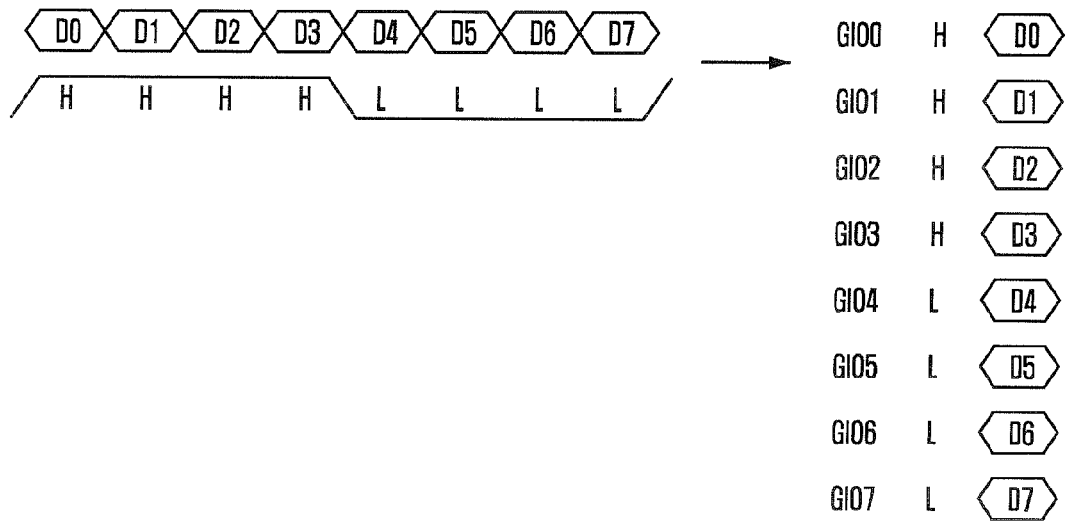
FIG. 3 illustrates an operation of a typical semiconductor memory device for aligning serial input data for transfer to data input/output lines.

The semiconductor memory device in accordance with the embodiment has the same configuration as the typical semiconductor memory device shown in FIG. 1 except that a test unit 850 is provided thereto.

Referring to FIG. 8, the semiconductor memory device includes a data alignment unit 820, data input/output lines GIO0 to GIO7, a matching unit 830, and a test unit 850. The data alignment unit 820 aligns serial input data D0 to D7 in parallel to output aligned data to lines ALIGNR_0, ALIGNF_0, ALIGNR_1, ALIGNF_1, ALIGNR_2, ALIGNF_2, ALIGNR_3 and ALIGNF_3. The data input/output lines GIO0 to GIO7 correspond to the aligned data, respectively. The matching unit 830 receives a burst length setting signal BL4_D and an on-the-fly mode signal BLFLYB_D to set correspondence between the aligned data and the data input/output lines GIO0 to GIO7. The test unit 850 activates the burst length setting signal BL4_D and the on-the-fly mode signal BLFLYB_D when a change signal CHANGE is activated.

The matching unit 830 includes a zeroth line ALIGNR_0, a first line ALIGNF_0, a second line ALIGNR_1, a third line ALIGNF_1, a fourth line ALIGNR_2, a fifth line ALIGNF_2, a sixth line ALIGNR_3 and a seventh line ALIGNF_3 through which the serial input data are transferred in a sequence of their input (i.e., D0=ALIGNR_0, D1=ALIGNF_0, D2=ALIGNR_1, D3=ALIGNF_1, D4=ALIGNR_2, D5=ALIGNF_2, D6=ALIGNR_3 and D7=ALIGNF_3). Basically, in a case where the burst length is 8, and both a burst length setting signal BL4 and a on-the-fly mode signal BLFLYB are deactivated, the zeroth to seventh lines ALIGNR_0, ALIGNF_0, ALIGNR_1, ALIGNF_1, ALIGNR_2, ALIGNF_2, ALIGNR_3 and ALIGNF_3 are matched to the data input/output lines GIO0, GIO1, GIO2, GIO3, GIO4, GIO5, GIO6 and GIO7, respectively, in the above-listed sequence. In other words, the input lines of the matching unit 830 are matched to the output lines of the matching unit 830 in the same sequence. That is, zeroth line ALIGNR_0 is matched to the zeroth line ALIGNRD_0, the first line ALIGNF_0 is matched to the first line ALIGNFD_0, the third line ALIGNR_1 is matched to the third line ALNGNRD_1, the fourth line ALIGNF_1 is matched to the fourth line ALIGNFD_1, and the like.

In the case where the burst length is 4, and the burst length setting signal BL4D is activated, the fourth line ALIGNR_2, the fifth line ALIGNF_2, the sixth line ALIGNR_3 and the seventh line ALIGNF_3 are matched to the data input/output lines GIO0, GIO1, GIO2 and GIO3, respectively, in the above-listed sequence. Also, in the case where the on-the-fly mode signal is activated, and the on-the-fly mode signal BLFLYB_D has a logic low level, the zeroth line ALIGNR_0, the first line ALIGNF_0, the second line ALIGNR_1 and the third line ALIGNF_1 are matched to the data input/output lines GIO4, GIO5, GIO6 and GIO7, respectively, in the above-listed sequence. Since the matching unit 830 is the same as the typical matching unit 130 and the typical matching unit 130 is described above, a detailed description of the matching unit 830 will be omitted.

The test unit 850 outputs the burst length setting signal BL4 and the on-the-fly mode signal BLFLYB as they are received in a normal mode (i.e., BL4=BL4_D and BLFLYB=BLFLYB_D).

However, when the change signal CHANGR is activated in a test mode, the test unit 850 activates both the burst length setting signal BL4_D and the on-the-fly mode signal BLFKYB_D. Accordingly, when the change signal CHANGE is activated, the fourth line ALIGNR_2, the fifth line ALIGNF_2, the sixth line ALIGNR_3 and the seventh line ALIGNF_3 are matched to the data input/output lines GIO0, GIO1, GIO2 and GIO3, respectively, in the above-listed sequence. Also, the zeroth line ALIGNR_0, the first line ALIGNF_0, the second line ALIGNR_1 and the third line ALIGNF_1 are matched to the data input/output lines GIO4, GIO5, GIO6 and GIO7, respectively, in the above-listed sequence.

Consequently, when the change signal CHANGE is activated, the data D0, D1, D2 and D3 are loaded on the data input/output lines GIO4, GIO5, GIO6 and GIO7, respectively, in the above-listed sequence. Also, the data D4, D5, D6 and D7 are loaded on the data input/output lines GIO0, GIO1, GIO2 and GIO3, respectively, in the above-listed sequence. In short, the sequence of loading the data D0 to D7 on the input/output lines GIO0 to GIO7 is different from the sequence of inputting data into the semiconductor memory device.

The semiconductor memory device in accordance with the third embodiment has an advantage that the data input sequence can be changed by simply adding the test unit 850 to the typical semiconductor memory device. However, since the matching unit 830 can change the correspondence of the data D0 to D7 only in a predetermined manner, the semiconductor memory device has a limitation in freely changing the data input sequence.

For reference, when the change signal CHANGE is activated, the operation of the semiconductor memory device is the same as that shown in FIG. 6.

Figure 9:
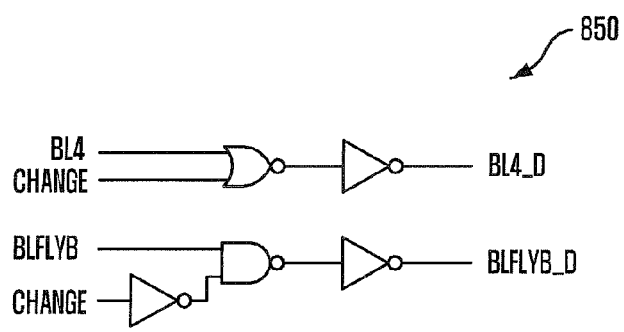
FIG. 9 is a circuit diagram of a test unit shown in FIG. 8.

FIG. 9 is a circuit diagram of the test unit shown in FIG. 8.

Referring to FIG. 9, when the change signal CHANGE is deactivated and the change signal CHANGE has a logic low level, the test unit 850 outputs the burst length setting signal BL4 and the on-the-fly mode signal BLFLYB as they are received (i.e., BL4=BL4_D, and BLFLYB=BLFLYB_D). On the contrary, when the change signal CHANGE is activated and the change signal CHANGE has a logic high level, the test unit 850 activates the burst length setting signal BL4_D and the on-the-fly mode signal BLFLYB_D regardless of the received signals BL4 and BLFLYB. That is, the burst length setting signal BL4_D has a logic high level, and the on-the-fly mode signal BLFLYB_D has a logic low level. Accordingly, if the change signal CHANGE is activated, the matching unit 830 changes the sequence of the data D0 to D7 to load the changed data on the data input/output lines GIO0 to GIO7.

Hereinafter, a method for testing a semiconductor memory device in accordance with an embodiment of the invention will be described with reference to FIGS. 4 to 7.

The method includes: inputting data D0 to D7 from the testing apparatus in series; aligning the serial input data D0 to D7 in parallel; and realigning the aligned serial data D0 to D7 in response to one or more change signals CHANGE<0:N>.

In more detail, the data D0 to D7 are input in series from the outside through a buffer 420 or 720. Then, the serial input data D0 to D7 are latched and aligned based on the data strobe signals DQSR and DQSF.

In the typical memory device, the data D0 to D7 are transferred into the memory device through the data input/output lines in the sequence of their input. On the contrary, in the semiconductor in accordance with the embodiments of the invention, the sequence of the input data D0 to D7 are changed by the realignment unit 430 or 740. For example, the realignment unit 430 changes the correspondence between the input data D0 to D7 and the data input/output lines (FIG. 4), and the realignment unit 740 realigns data loaded on the data input/output lines (FIG. 7).

Therefore, even if the data D0 to D7 cannot be input in a desired sequence (for example, in a sequence of 'High', 'High', 'Low', 'High', 'Low', 'High' and 'Low') in a test mode due to the low operating speed of testing apparatus, the semiconductor memory device itself can change the sequence of the input data D0 to D7. This allows the semiconductor memory device to easily realize a desired data pattern.

In accordance with the embodiments of the invention, the sequence of the data input into the semiconductor memory device can be changed in response to the change signal. Accordingly, various data patterns can be realized even if the testing apparatus is slower than the semiconductor memory device. For example, even if data D0 to D3 of a logic high level and data D4 to D7 of a logic low level are received from the testing apparatus, the semiconductor memory device itself can modify the data pattern (for example, the sequence of the logic levels of the data D0 to D7 may be changed as follows: 'High', 'Low', 'High', 'Low', 'High', 'Low', 'High' and 'Low').

Accordingly, it is possible to provide a desired data pattern while testing the semiconductor memory device, and thus to improve the screen ability of the semiconductor memory device.

It should be understood that various manners for changing the sequence of input data D0 to D7 can be easily realized by those skilled in the art through appropriately selecting the number of the change signals CHANGE<0:N> and the data realigning methods corresponding to the respective change.

While the invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
an alignment unit configured to align externally supplied serial data to parallel data;
a plurality of data input/output lines corresponding to the aligned parallel data, respectively; and
a realignment unit configured to selectively change the correspondence between the aligned parallel data and the data input/output lines in response to one or more change signals when the device is in a test mode, wherein the realignment unit is further configured to perform the selective change of the correspondence between the aligned parallel data and the data input/output lines after the aligned parallel data is output from the alignment unit and while the device remains in the test mode.

2. The semiconductor memory device as recited in claim 1, wherein the alignment unit is configured to align the serial data in parallel, the serial data being input into the alignment unit in series according to a burst length.

3. The semiconductor memory device as recited in claim 1, wherein the realignment unit is further configured to match different ones of the aligned parallel data to different ones of the data input/output lines, respectively, and change the matching so that the matched ones of the aligned parallel data and the data input/output lines change to different pairs in response to the one or more change signals.

4. A semiconductor memory device, comprising:
an alignment unit configured to align externally supplied serial data to parallel data;
a plurality of data input/output lines configured to transfer the aligned parallel data; and
a realignment unit configured to selectively realign the aligned parallel data transferred through the data input/output lines, in response to one or more change signals when the device is in a test mode, wherein the realignment unit is further configured to perform the selective realignment of the aligned parallel data after the aligned parallel data is output from the alignment unit and while the device remains in the test mode.

5. The semiconductor memory device as recited in claim 4, wherein the alignment unit is configured to align the serial data in parallel, the serial data being input into the alignment unit in series according to a burst length.

6. A semiconductor memory device, comprising:
an alignment unit configured to align serial input data in parallel to parallel data;
a plurality of data input/output lines corresponding to the aligned parallel data, respectively;
a matching unit configured to change the correspondence between the aligned parallel data and the data input/output lines in response to a burst length setting signal and an on-the-fly mode signal; and
a test unit configured to activate the burst length setting signal and the on-the-fly mode signal when a change signal is activated and the device is in a test mode,
wherein the matching unit is further configured to perform the selective change of the correspondence between the aligned parallel data and the data input/output lines after the aligned parallel data is output from the alignment unit and while the device remains in the test mode.

7. The semiconductor memory device as recited in claim 6, wherein the matching unit comprises zeroth, first, second, third, fourth, fifth, sixth and seventh lines on which the aligned parallel data are loaded in a sequence of their input, and the plurality of data input/output lines comprises zeroth, first, second, third, fourth, fifth, sixth and seventh data input/output lines.

8. The semiconductor memory device as recited in claim 7, wherein the matching unit matches:
- the zeroth, first, second, third, fourth, fifth, sixth and seventh lines to the zeroth, first, second, third, fourth, fifth, sixth and seventh data input/output lines, respectively when the burst length is 8;
- the fourth, fifth, sixth, and seventh lines to the zeroth, first, second and third data input/output lines, respectively, when the burst length setting signal is activated and the burst length is 4; and
- the zeroth, first, second and third lines to the fourth, fifth, sixth and seventh data input/output lines, respectively when the on-the-fly mode signal is activated.

9. The semiconductor memory device as recited in claim 7, wherein when both the burst length setting signal and the on-the-fly mode signal are activated in response to the change signal in the test mode, the matching unit matches the zeroth, first, second and third lines to the fourth, fifth, sixth and seventh data input/output lines, and the fourth, fifth, sixth and seventh lines to the zeroth, first, second and third data input/output lines, respectively.

10. The semiconductor memory device as recited in claim 6, wherein the data input/output lines are global input/output lines.

11. The semiconductor memory device as recited in claim 6, wherein the matching unit is further configured to match different ones of the aligned parallel data to different ones of the data input/output lines, respectively, and change the matching so that the matched ones of the aligned parallel data and the data input/output lines change to different pairs in response to the burst length setting signal and the on-the-fly mode signal.

12. A method for testing a semiconductor memory device, the method comprising:
- inputting data in series using a testing apparatus;
- aligning the serial data in parallel; and
- realigning the aligned parallel data in response to one or more change signals when in a test mode, wherein the realigning of the aligned parallel data includes changing the correspondence between the aligned parallel data and data input/output lines and includes realigning, after the aligned parallel data is output from an alignment unit and while the device remains in the test mode, the aligned parallel data.

13. The method as recited in claim 12, wherein the testing apparatus has a slower clock frequency than a speed of the semiconductor memory device.

* * * * *